US010857567B2

(12) United States Patent
Singh et al.

(10) Patent No.: US 10,857,567 B2
(45) Date of Patent: Dec. 8, 2020

(54) ANALOG TO DIGITAL SIGNAL CONVERSION IN ULTRASOUND DEVICE

(71) Applicant: Butterfly Network, Inc., Guilford, CT (US)

(72) Inventors: Amandeep Singh, Jersey City, NJ (US); Kailiang Chen, Branford, CT (US); Tyler S. Ralston, Clinton, CT (US)

(73) Assignee: Butterfly Network, Inc., Guilford, CT (US)

( * ) Notice: Subject to any disclaimer, the term of this patent is extended or adjusted under 35 U.S.C. 154(b) by 338 days.

(21) Appl. No.: 16/011,776

(22) Filed: Jun. 19, 2018

(65) Prior Publication Data
US 2018/0361431 A1 Dec. 20, 2018

Related U.S. Application Data

(60) Provisional application No. 62/522,625, filed on Jun. 20, 2017.

(51) Int. Cl.
G01S 7/53 (2006.01)
G01S 7/524 (2006.01)
(Continued)

(52) U.S. Cl.
CPC ............ B06B 1/0215 (2013.01); G01S 7/524 (2013.01); G01S 7/53 (2013.01); G01S 15/89 (2013.01);
(Continued)

(58) Field of Classification Search
CPC ....... B06B 1/0215; B06B 1/06; B06B 1/0292; G01S 15/8915; G01S 15/89; G01S 7/524;
(Continued)

(56) References Cited

U.S. PATENT DOCUMENTS 4,829,491 A    5/1989  Saugeon et al.
5,844,445 A   12/1998  Takeyari
(Continued)

FOREIGN PATENT DOCUMENTS

AU    2018289344 A1  * 12/2019  ........... B06B 1/0215
CA       3065214 A1  * 12/2018  ............. G01S 15/89
(Continued)

OTHER PUBLICATIONS

Jiajian, Time-gain-compensation amplifier for ultrasonic echo signal processing. Faculty of EEMCS, Delft University of Technology, in partial fulfillment of MSc. Degree 2010: 1-81.
(Continued)

Primary Examiner — Daniel Pihulic
(74) Attorney, Agent, or Firm — Wolf, Greenfield & Sacks, P.C.

(57) ABSTRACT

An ultrasound device is describe in which analog ultrasonic transducer output signal are directly converted to digital signals. The ultrasound device includes microfabricated ultrasonic transducers directly coupled to a sigma delta analog-to-digital converter in some instances. The direct digital conversion may allow for omission of undesirable analog processing stages in the ultrasound circuitry chain. In some situations, the ADC may be integrated on the same substrate as the ultrasound transducer.

16 Claims, 6 Drawing Sheets

(51) Int. Cl.
    *G01S 15/89*   (2006.01)
    *B06B 1/02*    (2006.01)
    *H03M 3/00*    (2006.01)
    B06B 1/06      (2006.01)
    H03M 1/74      (2006.01)

(52) U.S. Cl.
    CPC ......... *G01S 15/8915* (2013.01); *H03M 3/322* (2013.01); *B06B 1/0292* (2013.01); *B06B 1/06* (2013.01); *H03M 1/742* (2013.01); *H03M 3/464* (2013.01)

(58) Field of Classification Search
    CPC ......... G01S 7/53; H03M 3/322; H03M 1/742; H03M 3/464
    See application file for complete search history.

(56) References Cited

U.S. PATENT DOCUMENTS

| | | | |
|---|---|---|---|
| 6,356,152 B1 | 3/2002 | Jezdic et al. | |
| 6,404,281 B1 | 6/2002 | Kobayashi | |
| 7,313,053 B2 | 12/2007 | Wodnicki | |
| 7,449,958 B1 | 11/2008 | Voo | |
| 7,605,660 B1 | 10/2009 | Kobayashi | |
| 8,662,395 B2 | 3/2014 | Melandso et al. | |
| 8,852,103 B2 | 10/2014 | Rothberg et al. | |
| 9,229,097 B2 | 1/2016 | Rothberg et al. | |
| 9,473,136 B1 | 10/2016 | Chen et al. | |
| 9,492,144 B1 | 11/2016 | Chen et al. | |
| 9,521,991 B2 | 12/2016 | Rothberg et al. | |
| 9,592,030 B2 | 3/2017 | Rothberg et al. | |
| 9,705,518 B2 | 7/2017 | Chen et al. | |
| 9,933,516 B2 | 4/2018 | Chen et al. | |
| 9,958,537 B2 | 5/2018 | Chen et al. | |
| 10,014,871 B2 | 7/2018 | Chen et al. | |
| 10,082,488 B2 | 9/2018 | Chen et al. | |
| 10,082,565 B2 | 9/2018 | Chen et al. | |
| 10,116,263 B1 | 10/2018 | Broekaert | |
| 10,187,020 B2 | 1/2019 | Chen et al. | |
| 10,231,713 B2 | 3/2019 | Chen et al. | |
| 10,340,866 B2 | 7/2019 | Singh et al. | |
| 10,340,867 B2 | 7/2019 | Singh et al. | |
| 2001/0038450 A1 | 11/2001 | McCaffrey et al. | |
| 2004/0260214 A1 | 12/2004 | Echt et al. | |
| 2005/0148878 A1* | 7/2005 | Phelps | A61B 8/44 600/459 |
| 2006/0161359 A1 | 7/2006 | Lalla | |
| 2006/0164169 A1 | 7/2006 | Meck | |
| 2007/0001764 A1 | 1/2007 | Huang et al. | |
| 2007/0038091 A1 | 2/2007 | Shiki | |
| 2007/0232917 A1* | 10/2007 | Bae | G01N 29/07 600/447 |
| 2007/0242567 A1 | 10/2007 | Daft et al. | |
| 2007/0287923 A1 | 12/2007 | Adkins et al. | |
| 2009/0002073 A1 | 1/2009 | Kim et al. | |
| 2009/0157130 A1 | 6/2009 | Ideker et al. | |
| 2009/0184853 A1 | 7/2009 | Udupa et al. | |
| 2009/0250729 A1 | 10/2009 | Lemmerhirt et al. | |
| 2010/0152587 A1 | 6/2010 | Haider et al. | |
| 2010/0166228 A1 | 7/2010 | Steele et al. | |
| 2010/0234736 A1 | 9/2010 | Corl | |
| 2010/0237807 A1 | 9/2010 | Lemmerhirt | |
| 2010/0246648 A1 | 9/2010 | Rocamora et al. | |
| 2010/0317972 A1 | 12/2010 | Baumgartner et al. | |
| 2010/0327695 A1 | 12/2010 | Goel et al. | |
| 2011/0115562 A1 | 5/2011 | Gilbert | |
| 2011/0130109 A1 | 6/2011 | Ogasawara | |
| 2011/0148682 A1 | 6/2011 | Rigby et al. | |
| 2011/0205096 A1 | 8/2011 | Katsis et al. | |
| 2012/0163129 A1* | 6/2012 | Antoine | B06B 1/0292 367/138 |
| 2012/0265491 A1 | 10/2012 | Drummy | |
| 2013/0056622 A1 | 3/2013 | Tualle et al. | |
| 2013/0064043 A1 | 3/2013 | Degertekin et al. | |
| 2014/0088425 A1 | 3/2014 | Tang et al. | |
| 2014/0240482 A1 | 8/2014 | Ikeda et al. | |
| 2014/0288425 A1 | 9/2014 | Rothberg et al. | |
| 2015/0032002 A1 | 1/2015 | Rothberg et al. | |
| 2015/0041317 A1 | 2/2015 | Chan | |
| 2015/0086221 A1 | 3/2015 | Shringarpure et al. | |
| 2015/0145597 A1 | 5/2015 | Huang et al. | |
| 2015/0280662 A1 | 10/2015 | Nimran et al. | |
| 2015/0297193 A1 | 10/2015 | Rothberg et al. | |
| 2015/0298170 A1* | 10/2015 | Rothberg | B81B 3/0021 257/416 |
| 2015/0374335 A1 | 12/2015 | Brown et al. | |
| 2016/0228099 A1 | 8/2016 | Matsumura | |
| 2017/0026011 A1 | 1/2017 | Khaw | |
| 2017/0143306 A1 | 5/2017 | Rothberg et al. | |
| 2017/0160239 A1 | 6/2017 | Chen et al. | |
| 2017/0160387 A1 | 6/2017 | Chen et al. | |
| 2017/0160388 A1 | 6/2017 | Chen et al. | |
| 2017/0163225 A1 | 6/2017 | Chen et al. | |
| 2017/0163276 A1 | 6/2017 | Chen et al. | |
| 2017/0169899 A1 | 6/2017 | Lal et al. | |
| 2017/0202541 A1 | 7/2017 | Ralston | |
| 2017/0264307 A1 | 9/2017 | Chen et al. | |
| 2017/0296145 A1* | 10/2017 | Rothberg | B06B 1/02 |
| 2017/0307739 A1 | 10/2017 | Chen et al. | |
| 2018/0070925 A1 | 3/2018 | Chen et al. | |
| 2018/0210073 A1 | 7/2018 | Chen et al. | |
| 2018/0360426 A1 | 12/2018 | Singh et al. | |
| 2018/0361431 A1* | 12/2018 | Singh | G01S 15/89 |
| 2018/0367110 A1 | 12/2018 | Singh et al. | |
| 2018/0367111 A1 | 12/2018 | Singh et al. | |
| 2019/0050618 A1 | 2/2019 | Khuri-Yakub et al. | |
| 2019/0140603 A1 | 5/2019 | Chen et al. | |
| 2019/0142389 A1 | 5/2019 | Singh et al. | |
| 2019/0149109 A1 | 5/2019 | Singh et al. | |
| 2019/0149110 A1 | 5/2019 | Singh et al. | |

FOREIGN PATENT DOCUMENTS

| | | | |
|---|---|---|---|
| CN | 103607130 A | | 2/2014 |
| CN | 110771044 A * | 2/2020 | ......... G01S 15/8915 |
| KR | 20200018659 A * | 2/2020 | ............ H03M 3/322 |
| TW | 201445554 A | | 12/2014 |
| WO | WO 2007/096636 A1 | | 8/2007 |
| WO | WO 2015/189149 A1 | | 12/2015 |
| WO | WO 2017/097968 A1 | | 6/2017 |
| WO | WO 2018/236778 A1 | | 12/2018 |
| WO | WO 2018/236779 A1 | | 12/2018 |
| WO | WO 2018/236786 A1 | | 12/2018 |
| WO | WO 2018/236799 A1 | | 12/2018 |
| WO | WO-2018236786 A1 * | 12/2018 | ............ G01S 15/89 |

OTHER PUBLICATIONS

Kim, Fully Integrated CMOS Ultrasound Transceiver Chip for High-Frequency High-Resolution Itrasonic Imaging Systems. PhD Dissertation. The Pennsylvania State University College of Engineering. Dec. 2009; 157 pages.

Wygant et al. A miniature real-time volumetric ultrasound imaging system. Medical Imaging 2005: Ultrasonic Imaging and Signal Processing. vol. 5750. International Society for Optics and Photonics, 2005; 12 pages.

International Preliminary Report on Patentability dated Jan. 2, 2020 in connection with International Application No. PCT/US2018/038166.

International Search Report and Written Opinion dated Sep. 10, 2018 in connection with International Application No. PCT/US2018/038166.

Taiwanese Office Action dated Jan. 19, 2018 in connection with Taiwanese Application No. 105139662.

Agarwal et al., Single-Chip Solution for Ultrasound Imaging Systems: Initial Results. 2007 IEEE Ultrasonics Symposium. Oct. 1, 2007;1563-6.

Chen et al., Ultrasonic Imaging Front-End Design for CMUT: A 3-Level 30Vpp Pulse-Shaping Pulser with Improved Efficiency and

(56) References Cited

OTHER PUBLICATIONS a Noise-Optimized Receiver. IEEE Asian Solid-State Circuits Conference. Nov. 12-14, 2012;173-6.

Cheng et al., An Efficient Electrical Addressing Method Using Through-Wafer Vias for Two-Dimensional Ultrasonic Arrays. 2000 IEEE Ultrasonics Symposium. 2000;2:1179-82.

Cheng et al., CMUT-in-CMOS ultrasonic transducer arrays with on-chip electronics. Transducers 2009. IEEE. Jun. 21, 2009;1222-5.

Cheng et al., Electrical Through-Wafer Interconnects with Sub-PicoFarad Parasitic Capacitance. 2001 Microelectromech Syst Conf. Aug. 24, 2001;18-21.

Daft et al., A Matrix Transducer Design with Improved Image Quality and Acquisition Rate. 2007 IEEE Ultrasonics Symposium. Oct. 1, 2007;411-5.

Daft et al., Microfabricated Ultrasonic Transducers Monolithically Integrated with High Voltage Electronics. 2004 IEEE Ultrasonics Symposium. Aug. 23, 2004;1:493-6.

Doody et al., Modeling and Characterization of CMOS-Fabricated Capacitive Micromachined Ultrasound Transducers. J Microelectromech Sys. Feb. 2011;20(1):104-118.

Gurun et al., Front-end CMOS electronics for monolithic integration with CMUT arrays: circuit design and initial experimental results. Proc Ultrason Symp. 2008;390-3.

Khuri-Yakub et al., Miniaturized Ultrasound Imaging Probes Enabled by CMUT Arrays with Integrated Frontend Electronic Circuits. Conf Proc IEEE Eng Med Biol Soc. 2010; 1:5987-90. doi:10.1109/IEMBS.2010.5627580. Epub Dec. 6, 2010. 13 pages.

Kim et al., Design and Test of a Fully Controllable 64x128 2-D CMUT Array Integrated with Reconfigurable Frontend ASICs for Volumetric Ultrasound Imaging. IEEE. International Ultrasonics Symposium Proceedings. Oct. 7-10, 2012;77-80. doi: 10.1109/ULTSYM.2012.0019.

Kupnik et al., Wafer-bonded CMUT meets CMOS. MEMS-based Ultrasonic Transducer Arrays including Electronics Integration. 2010 CMOS Emerging Technology Workshop. Whistler, Canada May 21, 2010. 22 pages.

Orozco, Programmable-Gain Transimpedance Amplifiers Maximize Dynamic Range in Spectroscopy Systems. Analog Dialogue. May 2013;47(05): 1-5.

\* cited by examiner

ANALOG TO DIGITAL SIGNAL CONVERSION IN ULTRASOUND DEVICE

RELATED APPLICATIONS

This Application claims the benefit under 35 USC § 119(e) of U.S. Provisional Patent Application Ser. No. 62/522,625, filed Jun. 20, 2017, and entitled "ANALOG TO DIGITAL SIGNAL CONVERSION IN ULTRASOUND DEVICE," which is hereby incorporated herein by reference in its entirety.

BACKGROUND

Field

The present application relates to ultrasound devices and the conversion of analog ultrasound transducer signals into digital signals.

Related Art

Ultrasound probes often include one or more ultrasound sensors which sense ultrasound signals and produce corresponding electrical signals. The electrical signals are processed in the analog or digital domain. Sometimes, ultrasound images are generated from the processed electrical signals.

BRIEF SUMMARY

According to an aspect of the present application, an ultrasound apparatus is provided, comprising an ultrasound sensor and an analog-to-digital converter (ADC) directly coupled to the ultrasound sensor to convert an analog output signal of the sensor into a digital signal. The ultrasound device may lack analog processing circuitry electrically between the ultrasound sensor and the ADC.

According to an aspect of the present application, a method of operating an ultrasound device is provided, comprising directly converting an analog electrical signal output by a microfabricated ultrasonic transducer into a digital signal.

According to an aspect of the present application, an ultrasound on a chip device is provided, comprising analog-to-digital converters (ADCs) directly coupled to ultrasonic transducers and configured to convert analog output signals of the ultrasonic transducers into digital signals.

According to an aspect of the present application, an ultrasound on a chip device is provided, comprising a micromachined ultrasonic transducer (MUT), and an analog-to-digital converter (ADC) coupled to the MUT without intervening analog processing circuitry.

According to an aspect of the present application, an ultrasound device is provided, comprising a first substrate having a plurality of micromachined ultrasonic transducers integrated thereon, a second substrate having an analog-to-digital converter (ADC) integrated thereon, the ADC being coupled to an output of an ultrasonic transducer of the plurality of ultrasonic transducers without intervening analog processing circuitry, and transmit circuitry integrated on the second substrate, coupled to the plurality of ultrasonic transducers, and configured to control transmission of ultrasound signals by the plurality of ultrasonic transducers.

According to an aspect of the present application an ultrasound device is provided, comprising a first substrate having a plurality of micromachined ultrasonic transducers and transmit circuitry integrated thereon, the transmit circuitry coupled to the plurality of ultrasonic transducers and configured to control transmission of ultrasound signals by the plurality of ultrasonic transducers, and a second substrate having an analog-to-digital converter (ADC) integrated thereon, the ADC being coupled to an output of an ultrasonic transducer of the plurality of ultrasonic transducers without intervening analog processing circuitry.

According to an aspect of the present application, a method of operating an ultrasound device is provided, comprising converting an analog electrical signal output by a microfabricated ultrasonic transducer into a digital signal without first performing processing of the analog electrical signal in an analog domain.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1A:
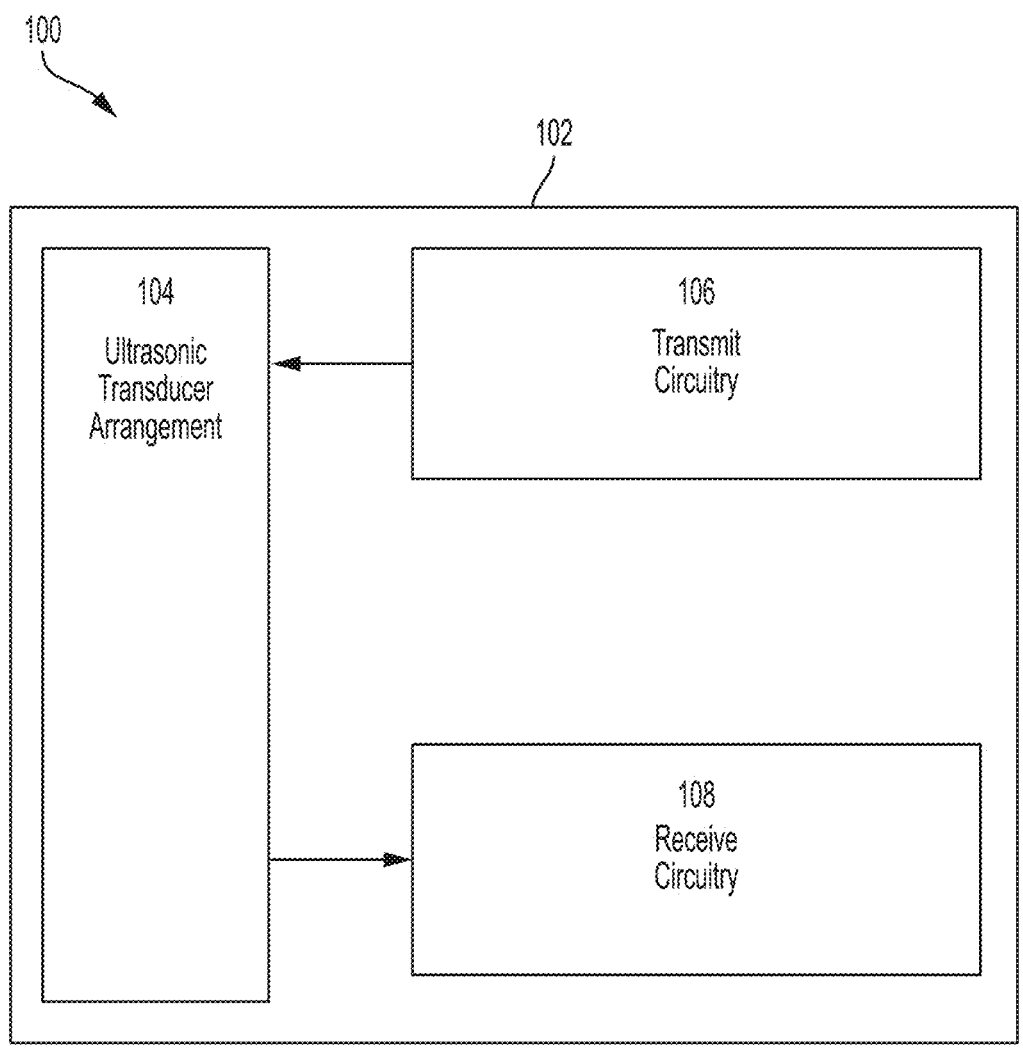
FIG. 1A is a block diagram of an ultrasound device including ultrasonic transducers, transmit circuitry, and receive circuitry on a single substrate.

Aspects of the present application relate to an ultrasound circuit including an ultrasonic transducer configured to produce an output (current or voltage) signal, and an analog-to-digital converter coupled directly to the ultrasonic transducer and configured to convert the analog signal from the ultrasonic transducer into a digital signal. In some embodiments, the transducer produces a current output signal, while in other embodiments the transducer produces a voltage output signal. The ADC may be coupled to the ultrasonic transducer without intervening analog processing circuitry, thus allowing for power savings by avoiding the power associated with analog processing such as amplification and filtering. For example, the circuit may lack a distinct amplifier (e.g., a trans-impedance amplifier or "TIA"), time gain compensation (TGC) circuit, and analog-to-digital converter driver. Still, the ADC may provide time gain compensation in at least some embodiments, thus providing an amplified digital signal representing the analog signal provided by the ultrasonic transducer.

According to an aspect of the present application, a method of processing electrical signals produced by an ultrasonic transducer is provided. The method comprises directly converting an analog electrical signal output by an ultrasonic transducer into a digital signal without first performing signal processing in the analog domain. Converting the analog signal to a digital signal may comprise performing time gain compensation. Subsequent to converting the electrical signal to a digital signal, further digital signal processing may optionally be performed.

According to an aspect of the present application, an ultrasound circuit includes an ADC with built-in time gain compensation (TGC) functionality. The ADC may include a digital-to-analog converter (DAC) with a controllable reference current. The reference current may be dynamically adjusted during a reception period in which the ultrasonic transducer receives an ultrasound signal, thus providing variable gain output from the ADC. As a result, a distinct analog TGC circuit may be omitted from the ultrasound circuit.

Aspects of the present application provide an ultrasound on a chip device comprising ultrasonic transducers and ADCs configured to digitize analog electrical signals produced by the ultrasonic transducers. The ultrasonic transducers may be microfabricated transducers, such as capacitive micromachined ultrasonic transducers (CMUTs), and the circuitry, such as the ADCs, may be integrated circuitry. The transducers and circuitry may be integrated on the same substrate, on different substrates, or a combination. For example, some of the circuitry may be integrated on a substrate with the transducers, while other circuitry may be on a separate substrate.

The aspects and embodiments described above, as well as additional aspects and embodiments, are described further below. These aspects and/or embodiments may be used individually, all together, or in any combination of two or more, as the application is not limited in this respect.

FIG. 1A is a block diagram of an ultrasound device including ultrasonic transducers, transmit circuitry, and receive circuitry on a single substrate, according to a non-limiting embodiment. As shown, the ultrasound device 100 comprises a substrate 102, an ultrasonic transducer arrangement 104, transmit circuitry 106, and receive circuitry 108.

The substrate 102 may be a semiconductor substrate, a complementary metal oxide semiconductor (CMOS) substrate (sometimes referred to herein simply as a "MOS" substrate) or other substrate on which the illustrated components may be fabricated. As an example, the substrate 102 may be a silicon substrate or a composite substrate comprising a MEMS substrate bonded with a MOS substrate.

The ultrasonic transducers 102 may be microfabricated ultrasonic transducers in at least some embodiments. For example, CMUTs, piezoelectric micromachined ultrasonic transducers (PMUTs) or other microfabricated ultrasonic transducers may be used. Any suitable number and arrangement of the ultrasonic transducers may be used, as the various aspects of the present application are not limited in this respect. For example, the arrangement of ultrasonic transducers may include hundreds, thousands, tens of thousands, or hundreds of thousands of ultrasonic transducers. The transducers may be arranged in an array or any other suitable arrangement.

Figure 2:
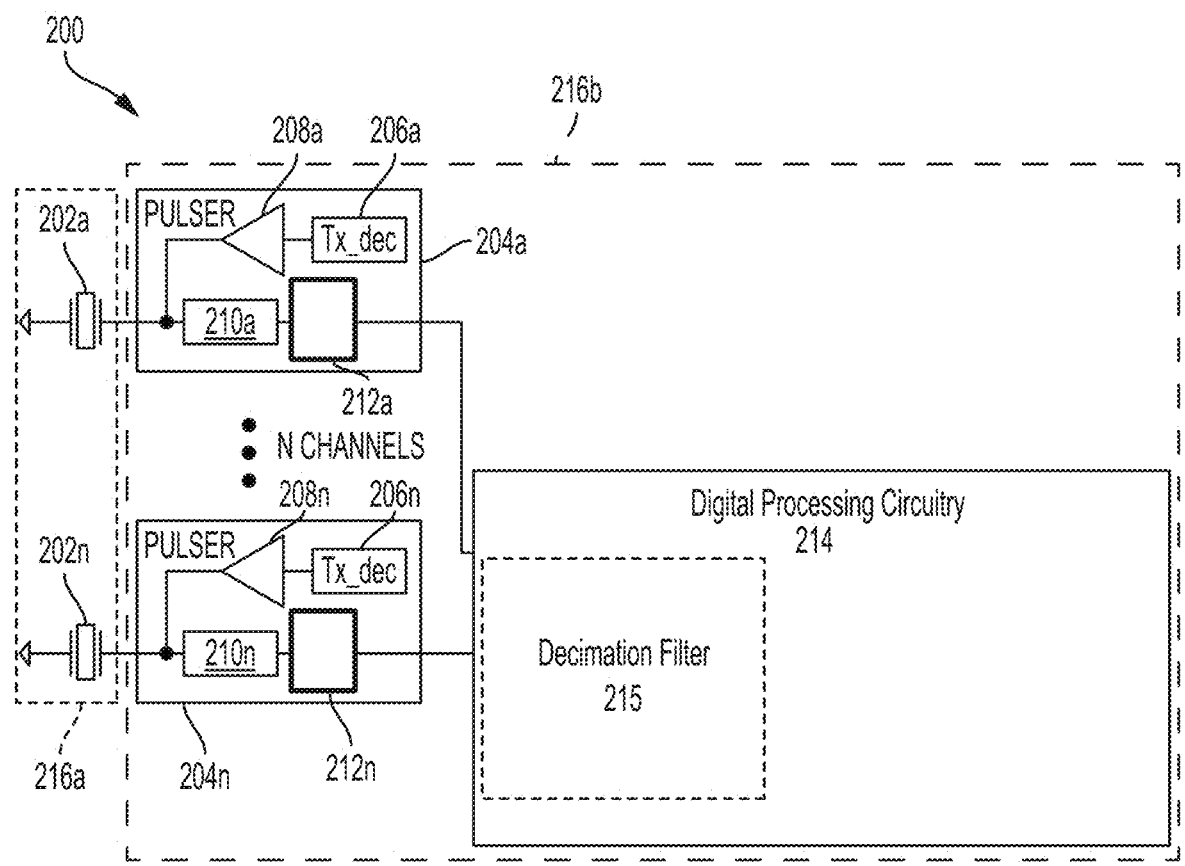
FIG. 2 illustrates a non-limiting example of an ultrasound device including ultrasonic transducers, transmit circuitry, and receive circuitry having an analog-to-digital converter (ADC) coupled to an ultrasonic transducer without intervening analog processing circuitry, according to a non-limiting embodiment of the present application.

The transmit circuitry 106 may include analog and/or digital circuitry for controlling transmission of ultrasound signals from the ultrasonic transducers. Examples of suitable transmit circuitry are illustrated in FIG. 2 and described further below. For example, the transmit circuitry may include a decoder circuit, waveform generator, and a pulser. However, not all aspects of the present application include transmit circuitry, as some aspects of the present application are directed to an ultrasound receiver having receive circuitry for processing of received ultrasound signals.

The receive circuitry 108 may include analog and/or digital circuitry for processing ultrasound signals received by the ultrasonic transducers. According to an embodiment of the present application, the receive circuitry includes an ADC and digital processing circuitry configured to process the digital signals produced by the ADC. Further examples are described below in connection with FIGS. 2-4.

Figure 1B:
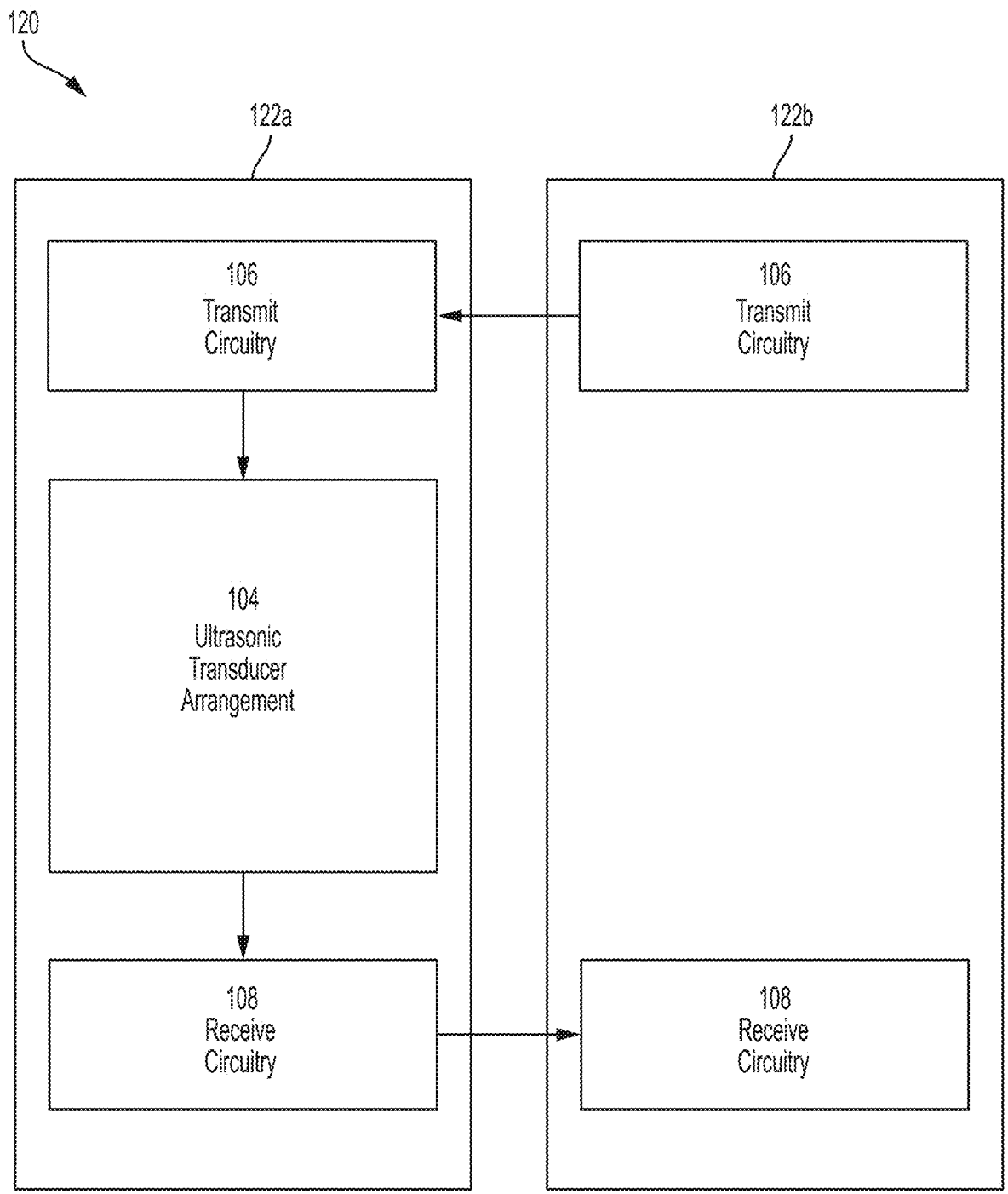
FIG. 1B illustrates an alternative to the ultrasound device of FIG. 1A, in which the transmit circuitry and receive circuitry are divided among multiple substrates, according to a non-limiting embodiment of the present application.

FIG. 1B illustrates an alternative ultrasound device 120 to the ultrasound device 100 of FIG. 1A, in which the transmit circuitry and receive circuitry are divided among multiple substrates, according to a non-limiting embodiment of the present application. The ultrasound device 120 includes two substrates, 122a and 122b, one or both of which may be any of the types of substrates described previously in connection with substrate 102, or any other suitable substrates. The substrates 122a and 122b need not be the same type of substrate as each other.

The division of transmit and receive circuitry across multiple substrates is non-limiting, as various implementations are possible. For example, analog transmit circuitry may be on the substrate 122a with the ultrasonic transducers, while digital transmit circuitry may be on the substrate 122b. A receive switch may be on the substrate 122a, while digital receive circuitry may be on the substrate 122b. In some embodiments, all the receive circuitry 108 may be on either the substrate 122a or 122b, and the transmit circuitry may be divided across substrates 122a-122b. Alternatively the transmit circuitry may be entirely on either one of the substrates 122a-122b, and the receive circuitry may be divided between the substrates. Thus, various combinations are possible.

FIG. 2 illustrates a non-limiting example of an ultrasound device including ultrasonic transducers, transmit circuitry, and receive circuitry having an analog-to-digital converter (ADC) coupled to an ultrasonic transducer without intervening analog processing circuitry, according to a non-limiting embodiment of the present application. The ultrasound device 200 includes N ultrasonic transducers 202a . . . 202n, wherein N is an integer. The ultrasonic transducers are sensors in some embodiments, producing electrical signals representing received ultrasound signals. The ultrasonic transducers may also transmit ultrasound signals in some embodiments. The ultrasonic transducers may be capacitive micromachined ultrasonic transducers (CMUTs) in some embodiments. The ultrasonic transducers may be piezoelectric micromachined ultrasonic transducers (PMUTs) in some embodiments. Alternative types of ultrasonic transducers may be used in other embodiments.

The ultrasound device 200 further comprises N circuitry channels 204a . . . 204n. The circuitry channels may correspond to a respective ultrasonic transducer 202a . . . 202n. For example, there may be eight ultrasonic transducers 202a . . . 202n and eight corresponding circuitry channels 204a . . . 204n. In some embodiments, the number of ultrasonic transducers 202a . . . 202n may be greater than the number of circuitry channels.

The circuitry channels 204a . . . 204n may include transmit circuitry, receive circuitry, or both. The transmit circuitry may include transmit decoders 206a . . . 206n coupled to respective pulsers 208a . . . 208n. The pulsers 208a . . . 208n may control the respective ultrasonic transducers 202a . . . 202n to emit ultrasound signals.

The receive circuitry of the circuitry channels 204a . . . 204n may receive the (analog) electrical signals output from respective ultrasonic transducers 202a . . . 202n. In the illustrated example, each circuitry channel 204a . . . 204n includes a respective receive circuit 210a . . . 210n and an ADC 212a . . . 212n. The receive circuit 210a . . . 210n may be controlled to activate/deactivate readout of an electrical signal from a given ultrasonic transducer 202a . . . 202n. An example of suitable receive circuits 210a . . . 210n is a switch. That is, in one embodiment the receive circuits are controllable switches which are switched during transmit mode to disconnect the ultrasonic transducers from the receive circuitry and during receive mode to connect the ultrasonic transducers to the receive circuitry. Alternatives to a switch may be employed to perform the same function. It should thus be appreciated that the receive circuits 210a-210n may lack analog processing circuitry to process the analog signals produced by the respective ultrasonic transducers. Rather, the receive circuits 210a-210n may, in some embodiments, simply control provision of the analog electrical signals produced by the ultrasonic transducers to the remainder of the receive circuitry.

Figure 4:
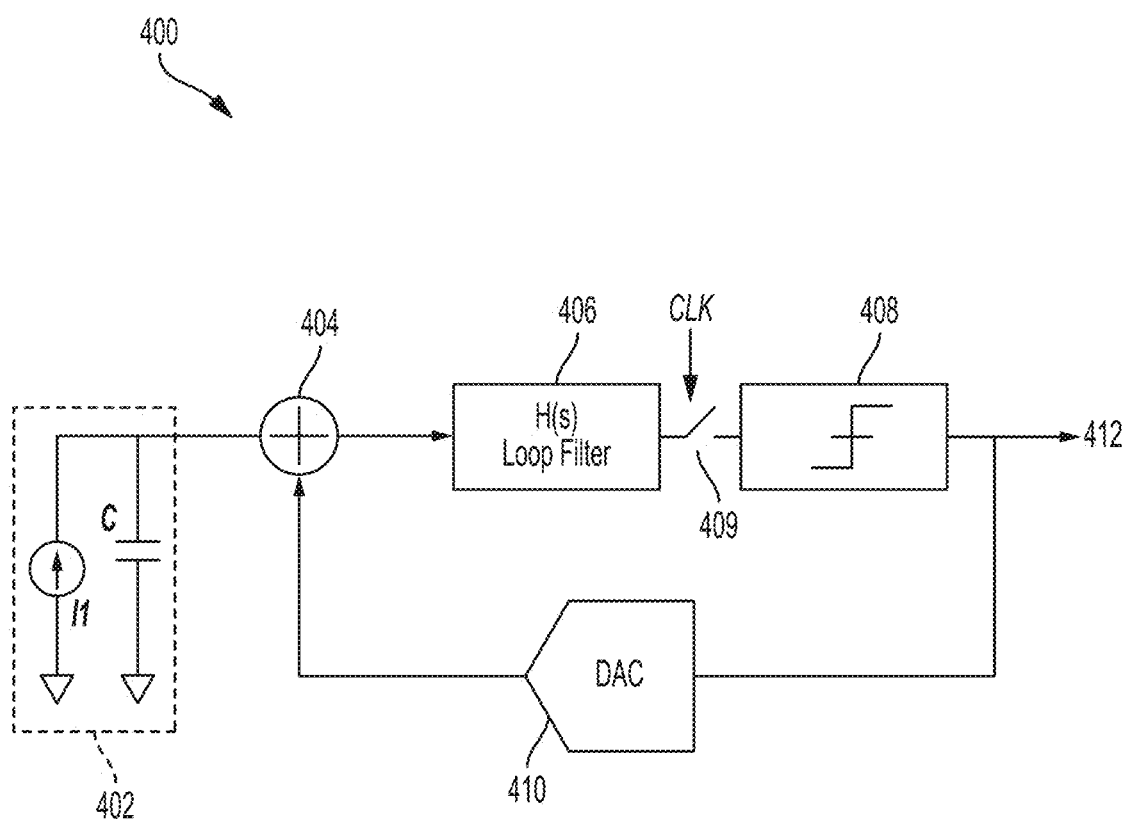
FIG. 4 illustrates an example of an ultrasonic transducer coupled with an ADC as may be implemented according to aspects of the present application.

As shown, the receive circuitry further comprises ADCs 212a-212n. An example of a suitable ADC is illustrated in FIG. 4 and described further below. Generally, though, the ADCs may convert the analog electrical signals—which are current signals in at least some embodiments—produced by the ultrasonic transducers into digital signals. Optionally, the ADCs may have built-in TGC functionality, and thus may be considered a combined ADC and TGC circuit in some embodiments. Since, as described previously, the receive circuits 210a-210n may lack analog processing circuitry, the ultrasound device 200 represents an example of a device in which ADCs are coupled to the ultrasonic transducers without intervening analog processing circuitry. Thus, the analog output signals of the ultrasonic transducers may be digitized without performing analog processing (processing in the analog domain), in at least some embodiments.

Converting the analog signals produced by the ultrasonic transducers to digital signals without intervening analog processing may provide various benefits. For example, power may be reduced by omitting typical analog processing stages, such as analog amplification and filtering. Also, real estate on a chip or other substrate may be conserved by omitting analog processing components, allowing for a reduction in the size of the ultrasound device compared to alternatives implementing analog processing circuitry.

The ultrasound device 200 may further comprise digital processing circuitry 214, taking any suitable form and performing any desirable digital processing functions. The digital processing circuitry may include a digital signal processor (DSP), a logic circuit, or any other suitable digital processing component. In the non-limiting example of FIG. 2, the digital processing circuitry 214 is illustrated as being shared by various circuitry channels. However, this illustration is non-limiting, as alternatives are possible. For example, further digital processing stages of the digital processing circuitry 214 may be specific to one or more of the circuitry channels.

In at least some embodiments, the digital processing circuitry 214 may perform decimation filtering owing to the lack of signal processing in the analog domain. Thus, a decimation filter 215 may be included and may be coupled at the output of the ADCs 212a-212n. While shown as part of the digital processing circuitry 214, the decimation filter 215 may alternatively be considered to be electrically between an ADC and the digital processing circuitry 214. That is, in some embodiments the decimation filter may be considered a separate component from the digital processing circuitry 214. In some embodiments, beamforming may be performed on the output signals of the ADCs 212a-212n prior to decimation with the decimation filter 215.

In some embodiments, additional processing in the digital domain may be performed to account for the analog characteristics of the circuit. For example, mapping of the digitized signal to the voltage as a function of time may be performed to account for the frequency response or other analog characteristics of the circuit.

While FIG. 2 illustrates a number of components as part of a circuit of an ultrasound device, it should be appreciated that the various aspects described herein are not limited to the exact components or configuration of components illustrated. For example, aspects of the present application may lack the transmit circuitry, the receive circuits 210a-210n, or other components.

The components of FIG. 2 may be located on a single substrate or on different substrates. For example, as illustrated, the ultrasonic transducers 202a . . . 202n may be on a first substrate 216a and the remaining illustrated components may be on a second substrate 216b. The first and/or second substrates may be semiconductor substrates, such as silicon substrates, or any of the types of substrates described previously in connection with FIGS. 1A-1B. In an alternative embodiment, the components of FIG. 2 may be on a single substrate. For example, the ultrasonic transducers 202a . . . 202n and the illustrated circuitry may be monolithically integrated on the same die (e.g., a semiconductor die, such as silicon). Such integration may be facilitated by using CMUTs as the ultrasonic transducers.

According to an embodiment, the components of FIG. 1A, 1B, or 2 form part of an ultrasound probe. The ultrasound probe may be handheld. In some embodiments, the components of FIG. 1A, 1B, or 2 form part of an ultrasound patch configured to be worn by a patient, or part of an ultrasound pill to be swallowed by a patient.

Figure 3:
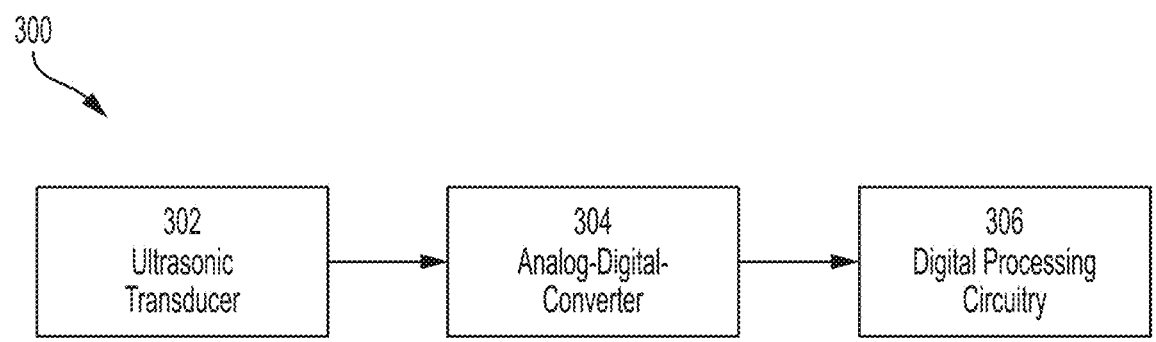
FIG. 3 illustrates an ultrasound signal chain in which an analog-to-digital converter is directly coupled to an ultrasonic transducer.

As described, an aspect of the present application provides an ultrasound device having an ADC directly coupled to an ultrasonic transducer to convert analog electrical signals produced by the ultrasonic transducer into digital signals. FIG. 3 illustrates a non-limiting example. It should be appreciated that FIG. 3 may represent a subset of components of the ultrasound device of FIG. 2, namely the ultrasonic transducer, ADC, and further digital processing circuitry (e.g., digital processing circuitry 214 of FIG. 2).

The ultrasound signal processing chain 300 of FIG. 3 includes an ultrasonic transducer 302, and ADC 304, and digital processing circuitry 306. The ADC may be directly coupled the ultrasonic transducer, without intervening analog processing circuitry.

The ultrasonic transducer 302 may be any of the types described previously herein in connection with FIGS. 1A, 1B, and 2. The ADC 304 may be a sigma delta ADC, such as a sigma delta continuous time ADC. A non-limiting example is illustrated in FIG. 4 and described further below. The ADC 304 may optionally include built-in TGC functionality, such that the ADC 304 may be considered a combined ADC and TGC circuit. In some embodiments, such as that shown in FIG. 3, an ADC may be provided for a respective ultrasonic transducer. In alternative embodiments, an ADC may be shared among multiple (two or more) ultrasonic transducers.

The digital processing circuitry 306 may be any suitable digital processing circuitry, including any of the types described previously in connection with digital processing circuitry 214 of FIG. 2.

FIG. 4 illustrates a non-limiting example of a suitable ADC 400 coupled directly to an ultrasonic transducer, according to a non-limiting embodiment of the present application. The ADC 400 represents an example of the implementation of any one of ADCs 212a-212n. The ultrasonic transducer 402 is represented schematically as a capacitor C and current source I1. The ultrasonic transducer may be, for example, a CMUT which produces a current output signal, represented by the current source.

The ADC of FIG. 4 may include a summer (or, more generally, a combiner) 404, a loop filter 406, a quantizer 408, and a digital-to-analog converter (DAC) 410. The ADC may receive an analog current signal from the ultrasonic transducer 402, filter the signal with filter 406, digitize the signal with the quantizer 408 and output the digital signal 412. The digital signal may also be fed back to the summer 404 via the DAC 410 to be combined with the analog signal from the ultrasonic transducer.

The summer 404 may be any suitable type of combiner component. In at least some embodiments, the summer 404 subtracts the current output by the DAC 410 from the current output by the ultrasonic transducer 402. Thus, any suitable circuitry for performing such a subtraction may be implemented. Because the output of the transducer may be a current and the output of the ADC 400 may also be a current, one implementation of the summer 404 is simply a node. That is, the summer 404 may not be a distinct component in some embodiments, but rather the output of the DAC 410 may simply be tied to the output of the ultrasonic transducer 402.

The loop filter 406 may be any suitable type of loop filter. For example, a first order filter, second order filter, or third order filter may be implemented. The loop filter may be a low pass filter (LPF) or a bandpass filter (BPF), and may be implemented using one or more operational amplifiers (op-amps), a voltage controlled oscillator (VCO), or a combination thereof. In some embodiments, the loop filter 406 may be a continuous time filter, which may provide the benefit of anti-aliasing protection. Still further alternatives are possible.

The quantizer 408 may be any suitable quantizer, such as a 1-bit or 2-bit quantizer. A switch 409 is illustrated for completeness, since such a switch is sometimes implemented as part of the quantization process of the quantizer 408. The switch may be controlled by a clock signal, CLK, which may be any suitable clocking signal of any suitable frequency.

The DAC 410 may be any suitable DAC for converting the digital signal output by the quantizer 408 to an analog signal for comparison with the analog signal from the ultrasonic transducer 402. As previously described, the inventors have appreciated that in some embodiments it may be desirable to provide time gain compensation for the output signal of the ultrasonic transducer. Typically, an ultrasound signal attenuates with time, and thus time gain compensation may be performed to facilitate processing and analysis of a received ultrasound signal. Rather than using a distinct TGC circuit, typically in analog form, aspects of the present application utilize a controllable DAC to provide variable gain. The DAC 410 may have a controllable (or "adjustable" or "programmable") reference current. A non-limiting example of a suitable DAC with a controllable current is illustrated in FIG. 5 and described further below.

Increasing the reference current may result in greater output signal from the DAC. Thus, aspects of the present application adjust or vary the DAC reference current during the time period corresponding to reception of an ultrasound signal by the ultrasonic transducer 402. In this manner, the gain of the DAC, and thus the ADC, may be increased over time, providing TGC functionality without a distinct TGC circuit. Because changing the reference current of the DAC can change the meaning of the resulting bit output, in some embodiments further processing of the DAC output signal is provided to map the output digital code of the ADC to an appropriate value for the given reference current value.

Figure 5:
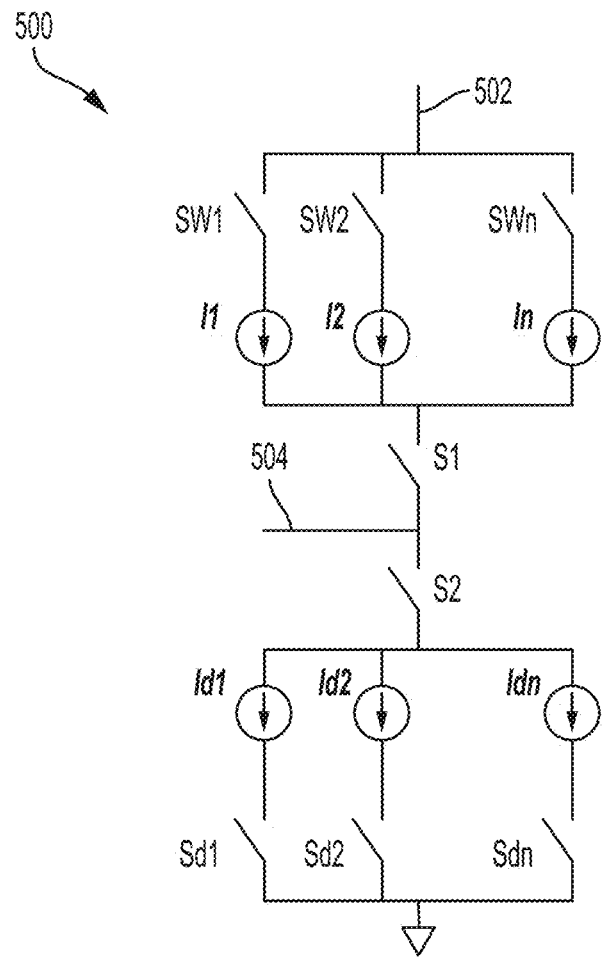
FIG. 5 illustrates a non-limiting example of a digital-to-analog converter (DAC) having a controllable reference current.

FIG. 5 illustrates a non-limiting example of a DAC 500 having a controllable reference current. In this non-limiting example, the DAC is a one-bit DAC, but other embodiments may employ a multi-bit DAC. The DAC 500 includes switches SW1, SW2 . . . SWn, current sources I1, I2 . . . In, switches S1 and S2, switches Sd1, Sd2 . . . Sdn, and current sources Id1, Id2 . . . Idn. A supply is provided at node 502. The output is taken from node 504. Suitable control signals may be provided to the switches SW1-SWn and Sd1-Sdn to provide a desired reference current (+Iref or −Iref) as described above in connection with DAC 410. For example, if S1 is ON it produces +Iref and if S2 is ON it produces −Iref. In this manner, TGC functionality may be realized. Again, though other DACs, including multi-bit DACs may be employed in alternative embodiments.

As should be appreciated from the non-limiting example of FIG. 4, an ADC may be provided which filters (via H(s) loop filter 406), amplifies, and digitizes an analog (current) signal from an ultrasonic transducer. Thus, analog amplification and filtering stages may be omitted, and the ADC may be coupled directly (or through a switch or other non-processing component) to the ultrasonic transducer. Thus, the power and real estate associated with analog processing components may be avoided in at least some embodiments.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described.

As described, some aspects may be embodied as one or more methods. The acts performed as part of the method(s) may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements.

As used herein, the term "between" used in a numerical context is to be inclusive unless indicated otherwise. For example, "between A and B" includes A and B unless indicated otherwise.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. An ultrasound on a chip device, comprising:
analog-to-digital converters (ADCs) coupled to ultrasonic transducers without intervening analog processing circuitry and configured to convert analog output signals of the ultrasonic transducers into digital signals;
wherein:
a first ultrasonic transducer of the ultrasonic transducers is a micromachined ultrasonic transducer (MUT); and
a first ADC of the ADCs is coupled to the MUT and configured to perform time gain compensation of an electrical signal produced by the MUT.

2. The ultrasound on a chip device of claim 1, further comprising a semiconductor substrate, wherein the ADCs and ultrasonic transducers are integrated on the semiconductor substrate.

3. The ultrasound on a chip device of claim 1, wherein the ultrasonic transducers are capacitive micromachined ultrasonic transducers (CMUTs).

4. The ultrasound on a chip device of claim 1, wherein the MUT is a capacitive micromachined ultrasonic transducer (CMUT).

5. The ultrasound on a chip device of claim 1, wherein the MUT is a piezoelectric micromachined ultrasonic transducer (PMUT).

6. The ultrasound on a chip device of claim 1, wherein a first ADC of the ADCs is coupled to the MUT through a switch.

7. The ultrasound on a chip device of claim 1, wherein the first ADC comprises a digital-to-analog (DAC) converter having a controllable reference current.

8. An ultrasound on a chip device, comprising:
analog-to-digital converters (ADCs) coupled to ultrasonic transducers without intervening analog processing circuitry and configured to convert analog output signals of the ultrasonic transducers into digital signals;
wherein:
a first ultrasonic transducer of the ultrasonic transducers is a micromachined ultrasonic transducer (MUT); and
a first ADC of the ADCs is coupled to the MUT and comprises a controllable reference current.

9. The ultrasound on a chip device of claim 8, wherein the first ADC comprises a digital-to-analog converter (DAC).

10. The ultrasound on a chip device of claim 9, wherein the DAC uses the controllable reference current.

11. A method of operating an ultrasound device, comprising:
directly converting an analog electrical signal output by a microfabricated ultrasonic transducer into a digital signal;
wherein converting the analog electrical signal into the digital signal comprises performing time gain compensation on the analog electrical signal.

12. The method of operating an ultrasound device of claim 11, wherein converting the analog electrical signal into a digital signal comprises converting the analog electrical signal using a sigma delta continuous time analog-to-digital converter (ADC).

13. The method of claim 11, further comprising performing digital processing on the digital signal.

14. The method of claim 11, wherein performing time gain compensation on the analog electrical signal comprises dynamically adjusting a reference current of a digital-to-analog converter (DAC).

15. A method of operating an ultrasound device, comprising:
converting an analog electrical signal output by a microfabricated ultrasonic transducer into a digital signal without first performing processing of the analog electrical signal in an analog domain; and
performing time gain compensation on the analog electrical signal as part of converting the analog electrical signal into a digital signal.

16. A method of operating an ultrasound device claim 15, comprising:
converting an analog electrical signal output by a microfabricated ultrasonic transducer into a digital signal without first performing processing of the analog electrical signal in an analog domain;
wherein the analog electrical signal is a current signal.

* * * * *

UNITED STATES PATENT AND TRADEMARK OFFICE
CERTIFICATE OF CORRECTION

Page 1 of 1

PATENT NO. : 10,857,567 B2
APPLICATION NO. : 16/011776
DATED : December 8, 2020
INVENTOR(S) : Amandeep Singh et al.

It is certified that error appears in the above-identified patent and that said Letters Patent is hereby corrected as shown below:

In the Claims

In Claim 16 at Column 10, please delete "A method of operating an ultrasound device claim 15" and replace it with --A method of operating an ultrasound device--.

Signed and Sealed this
Twenty-third Day of March, 2021

Drew Hirshfeld
*Performing the Functions and Duties of the
Under Secretary of Commerce for Intellectual Property and
Director of the United States Patent and Trademark Office*